(12) United States Patent
Bonilla et al.

(10) Patent No.: US 9,059,169 B2
(45) Date of Patent: Jun. 16, 2015

(54) E-FUSE STRUCTURES AND METHODS OF MANUFACTURE

(75) Inventors: Griselda Bonilla, Fishkill, NY (US);
Kaushik Chanda, Fishkill, NY (US);
Samuel S. Choi, Beacon, NY (US);
Ronald G. Filippi, Wappingers Falls, NY (US); Stephan Grunow, Poughkeepsie, NY (US); Naftali E. Lustig, Croton on Hudson, NY (US); Andrew H. Simon, Fishkill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 844 days.

(21) Appl. No.: 13/165,087

(22) Filed: Jun. 21, 2011

(65) Prior Publication Data

US 2012/0326269 A1  Dec. 27, 2012

(51) Int. Cl.
*H01L 21/26* (2006.01)
*H01L 23/525* (2006.01)
*H01L 23/522* (2006.01)
*H01L 21/768* (2006.01)

(52) U.S. Cl.
CPC ........ *H01L 23/5256* (2013.01); *H01L 23/5226* (2013.01); *H01L 21/76808* (2013.01); *H01L 21/76811* (2013.01); *H01L 21/76813* (2013.01); *H01L 21/768* (2013.01); *H01L 2924/0002* (2013.01)

(58) Field of Classification Search
CPC .......................... H01L 23/5256; H01L 23/5258
USPC ............ 257/529, E21.579, E23.149; 438/601
See application file for complete search history.

(56) References Cited

U.S. PATENT DOCUMENTS

| | | | |
|---|---|---|---|
| 6,111,301 A | 8/2000 | Stamper | |
| 6,924,185 B2 | 8/2005 | Anderson et al. | |
| 7,122,462 B2 | 10/2006 | Clevenger et al. | |
| 7,528,066 B2 | 5/2009 | Yang et al. | |
| 7,545,253 B2 | 6/2009 | Hsu et al. | |
| 7,572,682 B2 | 8/2009 | Yang et al. | |
| 7,732,922 B2 | 6/2010 | Yang et al. | |
| 8,916,461 B2 | 12/2014 | Bao et al. | |
| 2006/0278895 A1 | 12/2006 | Burr et al. | |
| 2008/0315353 A1* | 12/2008 | Wang et al. | ........... 257/529 |
| 2009/0045388 A1 | 2/2009 | Clevenger et al. | |
| 2009/0206447 A1 | 8/2009 | Basker et al. | |
| 2009/0302416 A1 | 12/2009 | Abou-Khalil et al. | |

OTHER PUBLICATIONS

Office Action for related U.S. Appl. No. 141079,232, filed Feb. 13, 2015, 7 pages.

\* cited by examiner

*Primary Examiner* — Jami M Valentine
(74) *Attorney, Agent, or Firm* — Catherine Ivers; Roberts Mlotkowski Safran & Cole, P.C.

(57) ABSTRACT

E-fuse structures in back end of the line (BEOL) interconnects and methods of manufacture are provided. The method includes forming an interconnect via in a substrate in alignment with a first underlying metal wire and forming an e-fuse via in the substrate, exposing a second underlying metal wire. The method further includes forming a defect with the second underlying metal wire and filling the interconnect via with metal and in contact with the first underlying metal wire thereby forming an interconnect structure. The method further includes filling the e-fuse via with the metal and in contact with the defect and the second underlying metal wire thereby forming an e-fuse structure.

18 Claims, 10 Drawing Sheets

E-FUSE STRUCTURES AND METHODS OF MANUFACTURE

FIELD OF THE INVENTION

The invention relates to semiconductor structures and methods of manufacture and, more particularly, to e-fuse structures in back end of the line (BEOL) interconnects and methods of manufacture.

BACKGROUND

In advanced technologies, electronic fuses (e-fuses) have been implemented at the polysilicon (PC) level. During programming, a high current pulse of short duration is passed through the structure, which irreversibly migrates silicide on top of the PC level. This migration, in turn, causes a change in resistance and thus acts as a programmable fuse. However, as scaling progresses, it becomes harder to implement these e-fuses at the silicon level due to a drop in maximum allowable currents through a lower metal layer, M1. Also, the collateral damage associated with the blowing of the fuse is becoming more difficult to contain.

Figure 19:
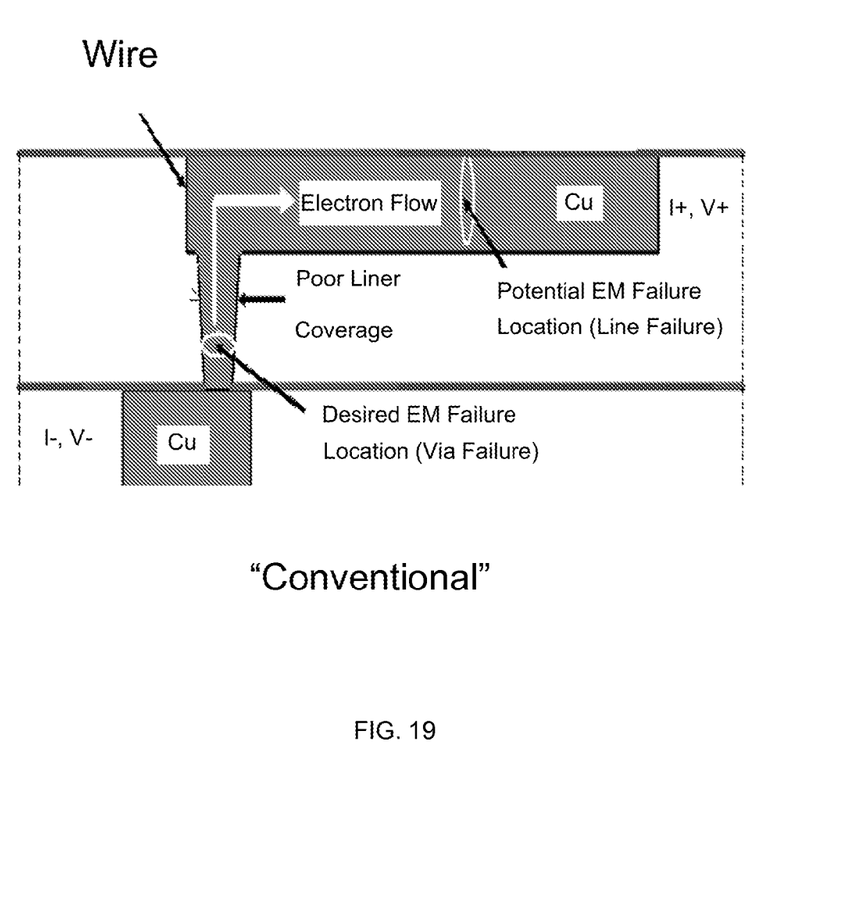
FIG. 19 show a conventional structure with an EM fail point in a wiring layer.

In a conventional metal fuse approach as shown, for example, in FIG. 19, a two-level structure is used in which the electron flow is from the interconnect structure (via) into the wire line. A high current would be applied between the I+ and I− connections to induce electromigration (EM) failure and the voltage across the structure would be measured using the V+ and V− connections. In such a structure, most of the failures should occur in the interconnect structure (via); however, some of these failures also occur in the wire line. The failures in the wire line, though, are less desirable since the cap layer, such as silicon nitride ($Si_3N_4$) or silicon carbide (SiC) may be compromised during the programming process. This lack of control over the failure location will lead to variability in the final resistance of the fuse structure after programming. Also, even if all failures occur in the interconnect structure (via), there can still be a large variability in the resistance of the fuse after the blow process, which may suggest that some of the vias did not fail completely.

Accordingly, there exists a need in the art to overcome the deficiencies and limitations described hereinabove.

SUMMARY

In a first aspect of the invention, a method comprises forming an interconnect via in a substrate in alignment with a first underlying metal wire and forming an e-fuse via in the substrate, exposing a second underlying metal wire. The method further comprises forming a defect with the second underlying metal wire and filling the interconnect via with metal and in contact with the first underlying metal wire thereby forming an interconnect structure. The method further comprises filling the e-fuse via with the metal and in contact with the defect and the second underlying metal wire thereby forming an e-fuse structure.

In another aspect of the invention, a method of forming an e-fuse structure and an interconnect structure comprises forming a plurality of wires in a dielectric layer and forming a first via in the dielectric layer to a first wire of the plurality of wires. The method further comprises forming a second via in the dielectric layer to a second wire of the plurality of wires. The method further comprises forming a defect from the second wire of the plurality of wires and filling the first via and the second via with metal material. The metal material contacts the first wire to form an interconnect structure and the metal material contacts the second wire and the defect to form an e-fuse.

In yet another aspect of the invention, a structure comprise a plurality of wires in a dielectric layer and a first via formed in the dielectric layer and extending to a first wire of the plurality of wires. The structure further comprises a second via formed in the dielectric layer to a second wire of the plurality of wires. The structure further comprises a defect formed in or from the second wire of the plurality of wire. The structure further comprises metal filling the first via and the second via. The metal contacts the first wire to form an interconnect structure and the metal contacts the second wire and the defect to form an e-fuse.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to e-fuse structures in back end of the line (BEOL) interconnects and methods of manufacture. More specifically, the invention is directed to e-fuse structures in BEOL copper interconnects and methods of manufacturing the same. In embodiments, the present invention implements the fuses at the copper (Cu) metal levels in BEOL, which takes advantage of the phenomenon of Cu electromigration (EM) to program the e-fuses. Thus, in embodiments, the e-fuse structures and interconnect structures of all aspects of the present invention can be formed at the same level, using similar processing steps. For example, a single metal deposition can be used to form both the e-fuse structures and the interconnect structures.

Advantageously, the e-fuses of the present invention are amenable to EM without compromising the reliability of the interconnects, compared to copper interconnect structures which are lined with materials such as such as tantalum (Ta) and tantalum nitride (TaN). In addition, in using the e-fuses of the present invention, via failure is more likely than line failure during the blow process. Also, the structures of the present invention require a lower current to blow the e-fuse, compared to a conventional structures. This provides much better control over the failure location thus leading to less variability in the final resistance of the fuse structure after programming. Also, the collateral damage associated with the event is easier to contain, compared with conventional e-fuse structures.

Also, the power requirements to cause EM in copper interconnects are much larger than the typical polysilicon level fuses. This is partly due to the fact that the liner materials used in copper (Cu) interconnects, such as tantalum (Ta) and tantalum nitride (TaN), need to be blown along with the Cu in order to achieve proper fuse programming. However, using the interconnects as the e-fuse compromises the reliability of the remaining interconnects. The present invention alleviates these concerns, in that the e-fuses have different metal characteristics than conventional interconnects, thus providing reliable interconnects and e-fuses.

Figure 1:
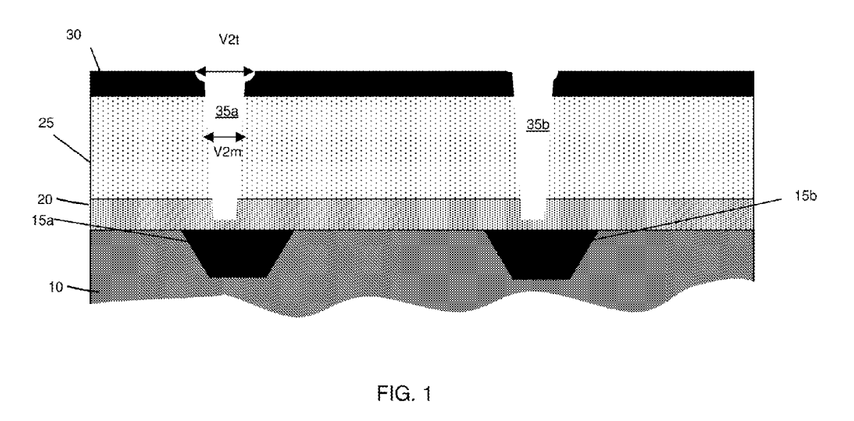
FIGS. 1-7 show processing steps and respective structures in accordance with aspects of the invention.

FIG. 1 shows processing steps and a respective structure in accordance with aspects of the invention. The structure of FIG. 1 is representative of any wiring level of a semiconductor device. In embodiments, the structure includes a substrate 10 that, in embodiments, is any insulator material such as oxide. In embodiments, the substrate 10 can be provided on any wafer such as any bulk substrate, including silicon or a silicon on insulator (SOI) substrate.

Wires 15a and 15b are formed in the substrate 10 using conventional lithographic, etching and deposition processes. For example, a resist is formed on the substrate 10 and exposed to light to form openings. A Reactive Ion Etch (RIE), for instance, forms trenches in the substrate 10, which are then filled with a conductive material such as copper; although other materials are also contemplated by the present invention. In embodiments, the structure, e.g., wires and substrate, can then be planarized using a chemical mechanical polishing (CMP).

Still referring to FIG. 1, a cap layer 20 is formed over the wires 15a and 15b and any exposed surfaces of the substrate 10. In embodiments, the cap layer 20 can be a bi-layer of SiN, Nblok, or metal caps such as CoWP, CVD-Co, etc., which alleviates corrosion of the wires 15a and 15b, in subsequent processing steps. An insulator layer 25 is formed on the cap layer 20 using, for example, a conventional deposition process. For example, the insulator layer 25 can be deposited using a chemical vapor deposition (CVD) process. In embodiments, the insulator layer 25 can be, for example, oxide or silicon dioxide; although other materials with a lower dielectric constant value are also contemplated by the present invention. The other materials can be Si-Me containing organosilicate materials (k=2.7-3.0). A hardmask 30 is formed on the insulator layer 25 using conventional processes (CVD). The hardmask 30 may be, for example, nitride.

Vias 35a and 35b are formed in the structure using conventional lithographic and etching processes. More specifically, the vias 35a and 35b are formed simultaneously through the hardmask 30 and insulator layer 25, in alignment with the respective wires 15a and 15b. In embodiments, the vias 35a and 35b may be formed partly through the cap layer 20; however, at least the via 35a will not punch through the cap layer 20 to the wire 15a. In embodiments, the via 35a will be used for an interconnect structure; whereas, the via 35b will be used for an e-fuse. In embodiments, the vias 35a and 35b have a tapered profile with dimension V2t having a larger cross section than dimension V2m.

Figure 2:
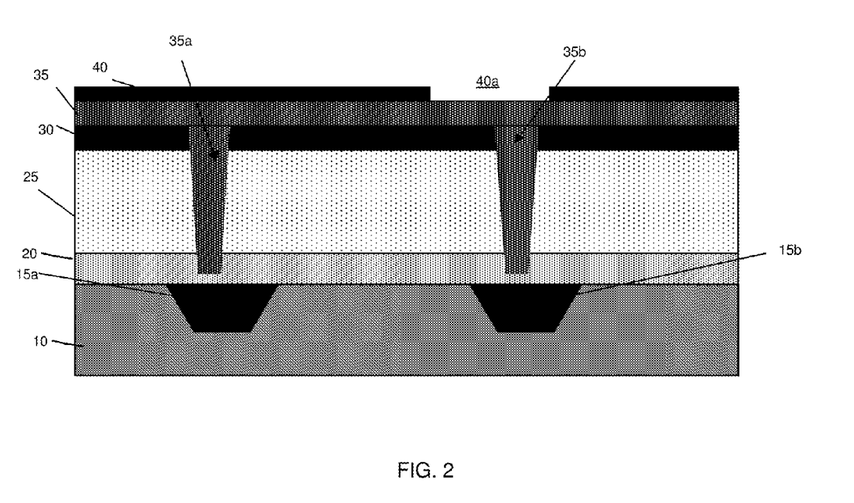

In FIG. 2, a material 35 is deposited in the vias 35a and 35b and on a surface of the hard mask 30. The material 35 may be, for example, any organic material such as an organic planarization layer. In optional embodiments, the material 35 can be planarized using, for example, a chemical mechanical polish (CMP) process. A bottom antireflective coating (BARC) or other type of resist 40 is deposited on the material 35. In embodiments, the BARC is used to enhance control of critical dimensions (CD) by suppressing standing wave effects and reflective notching caused by thin film interference. An offset opening 40a is formed in the resist 40 using conventional lithographic processes. In embodiments, the opening 40a is offset with respect to the filled via (via 35b).

Figure 3:
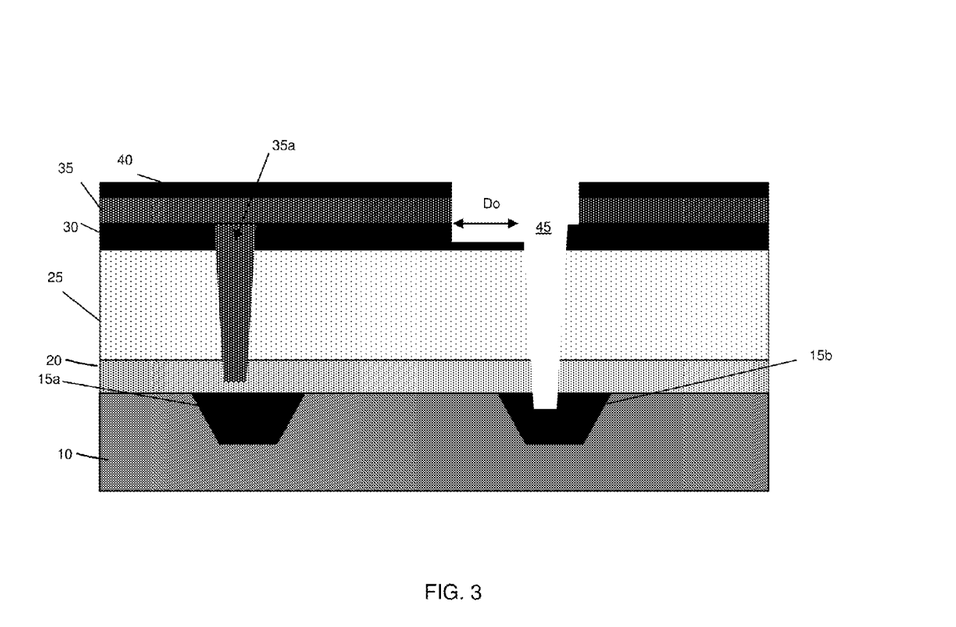

In FIG. 3, the structure undergoes an etching process, e.g., RIE, to form, for example, a via 45. In embodiments, the via 45 will punch through the hardmask layer 20, contacting the wire 15b. In embodiments, the via 45 may also extend into the wire 15b. As shown in FIG. 3, the via 45 has a overlap portion, $D_o$, which provides added protection; although, this overlap portion, $D_o$, will be removed in later processing steps. In this process, the overlap portion $D_o$, comprising the hardmask 30, will protect the underlying insulator layer 25 during the etching process. Also, due to the protection afforded by the resist 40, the depth of the via 35a will not be affected during this etching process.

Figure 4:
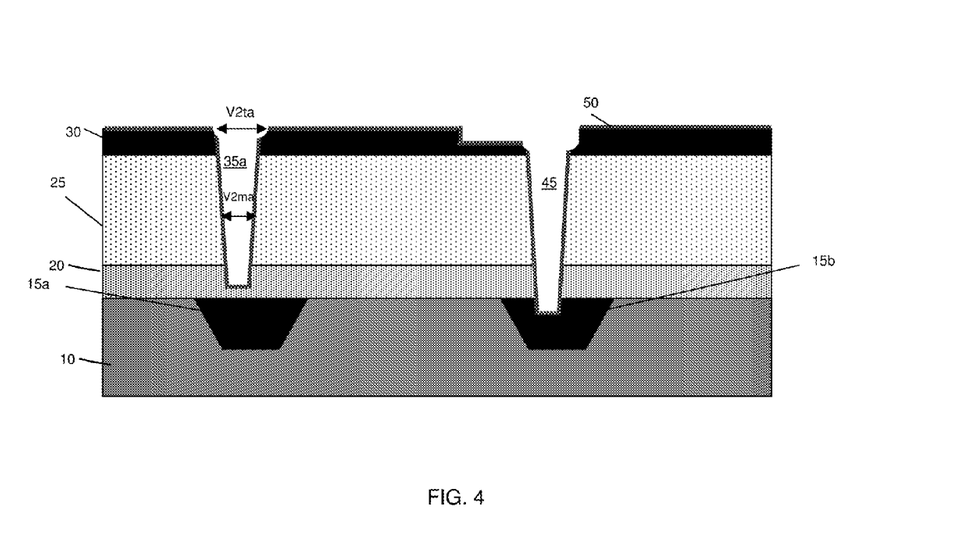

In FIG. 4, the resist 40 and material 35 are removed using conventional etching processes. For example, the material 35 is removed from the surface of the hardmask 30 and within the via 35a using a conventional via RIE process. In embodiments, the dimensions of the newly formed via 35a has dimensions V2ta and V2ma, which can accommodate critical dimension (CD) growth from a subsequent ashing process. In an optional embodiment, the hardmask 30 can be planarized, using CMP processes.

An optional film 50 is deposited within the vias 35a and 45, to form a protective barrier. For example, optional film 50 can be a low temperature oxide or SiN film, deposited to a depth of about 10 Å to 50 Å at the bottom of the vias 35a and 45; although other dimensions are also contemplated by the present invention. It should be understood that certain dimensions of the vias 35a and 45 will accommodate different thicknesses of the optional film 50. In any event, optional film 50 should not exceed a dimension that would otherwise pinch off the vias 35a and 45 so that additional material can be deposited in the via 45 in subsequent processes. In embodiments, optional film 50 can be used to inhibit corrosion of the wire 15b during subsequent processing steps, in particular, the deposition of organic material used to corrode the wire 15b.

Figure 5:
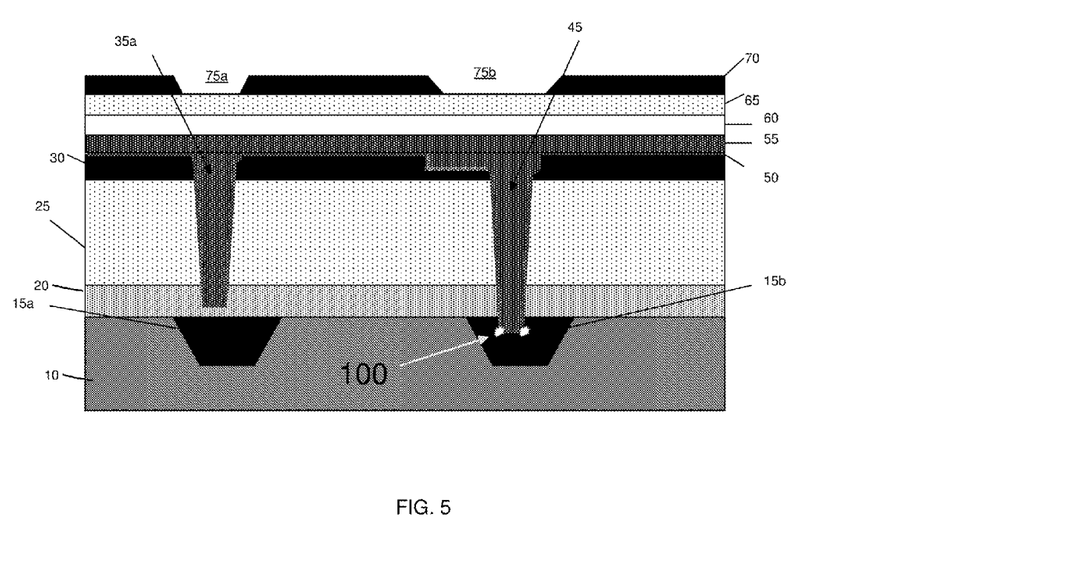

In FIG. 5, via 35a and via 45 are filled with material 55. Material 55 can be any organic material, e.g., organic planarization layer. The organic material 55 can corrode the metal of the wire 15b and form voids 100, i.e., defects. The organic material 55 will not contact the wire 15a, and will thus not cause any corrosion of the wire 15a. An oxide material 60, e.g., low temperature oxide, is deposited on the organic material 55 using conventional deposition processes. A BARC layer 65 is deposited on the oxide material 55, and a resist 70 is deposited on the BARC layer 65. The resist and BARC can be a single material which is patterned to form openings 75 and 75' in alignment with the filled vias 35a and 45.

Figure 6:
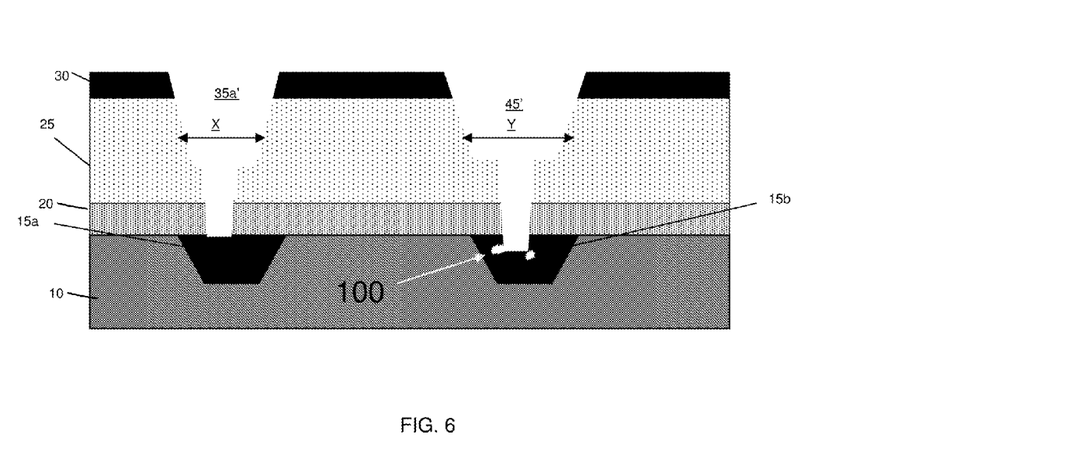

In FIG. 6, a trench etch is performed to form vias 35a' and 45'. The trench etch is any conventional etching processes (RIE). In embodiments, the trench etch extends the via 35a' to the wire 15a, thereby exposing the metal of the wire 15a. In embodiments, due to the additional processing associated with via 45', the profile of via 45' (used for the e-fuse) is different than the profile of via 35' (used for the interconnect). More specifically, cross section "Y" of via 45' is larger than the cross section "X" of via 35a'. Also, FIG. 6 shows the voids 100 formed in the wire 15b. Additional processing includes the removal of the oxide material 60, BARC layer 65 and resist 70.

Figure 7:
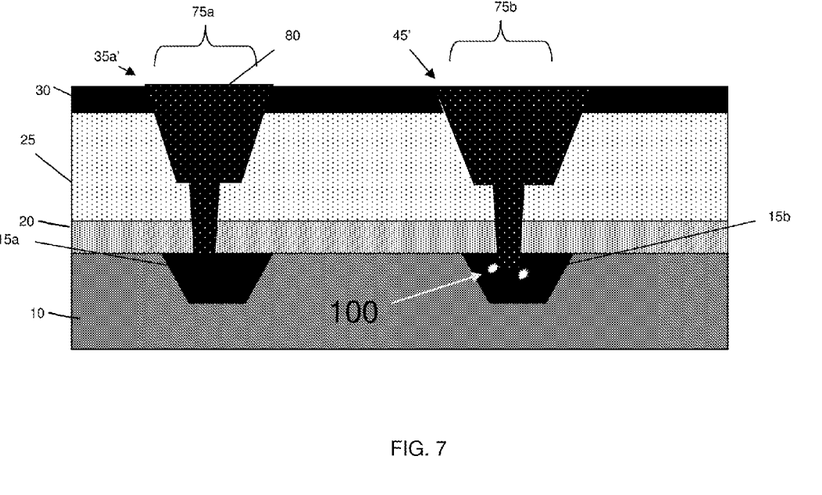

In FIG. 7, metal 80 is deposited in vias 35a' and 45' using conventional deposition methods. For example, the metal 80 is tungsten or TaN, which is deposited using an atomic layer deposition or sputtering process such as physical vapor deposition (PVD); although, other deposition processes are also contemplated by the present invention. In this way, an interconnect 75a is formed in contact with the wire 15a, and an e-fuse 75b is formed in contact with the wire 15b. As should be understood, the metal 80 contacts the voids 100, i.e., defects, formed in the wire 15b, which alters the characteristics of the metal (in comparison to the interconnect 75a) allowing it to work as an e-fuse 75b. In this way, it is possible to use the e-fuse 75b for rerouting chip logic, regulating speed or power consumption issues, or repair unexpected, potentially costly flaws, any of which by simply tripping the e-fuse.

Figure 8:
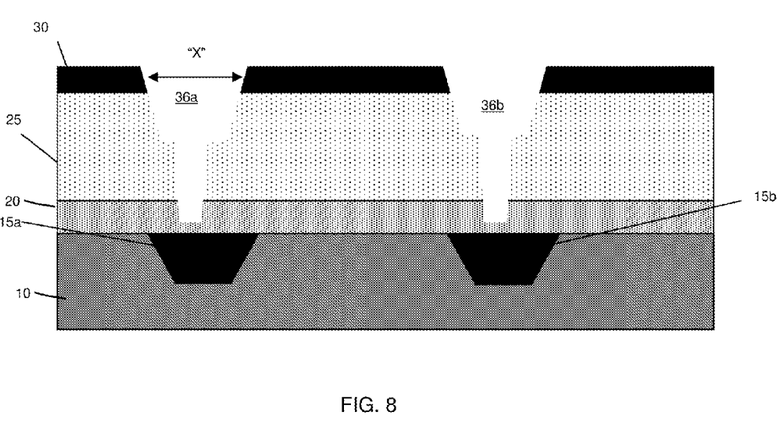
FIGS. 8-12 show processing steps and respective structures in accordance with additional aspects of the invention.

FIGS. 8-12 show processing steps and respective structures in accordance with additional aspects of the invention. More specifically, the structure of FIG. 8 is representative of any wiring level of a semiconductor device. In embodiments, the structure includes a substrate 10 that, in embodiments, is any insulator material. In embodiments, the substrate 10 can be provided on any wafer. The wafer is any bulk substrate, including silicon or a silicon on insulator (SOI) substrate. Wires 15a and 15b are formed in the substrate 10 using conventional lithographic, etching and deposition processes, as discussed above.

Still referring to FIG. 8, a cap layer 20 is formed over the wires 15a and 15b and any exposed surfaces of the substrate 10. In embodiments, cap layer 20 can be a nitride block, which alleviates corrosion of the wires 15a and 15b, in subsequent processing steps. An insulator layer 25 is formed on the cap layer 20 using a deposition process (CVD). In embodiments, the insulator layer 25 can be oxide or silicon dioxide; although other materials with a lower dielectric constant value are also contemplated by the present invention. These other materials may be Si-Me containing organosilicate materials (k=2.7-3.0). A hardmask 30 is formed on the insulator layer 25 using conventional processes such as CVD. The hardmask 30 may be nitride.

Vias 36a and 36b are formed in the structure using conventional lithographic and etching processes. More specifically, the vias 36a and 36b are formed simultaneously through hardmask 30 and insulator layer 25, in alignment with the respective wires 15a and 15b. In embodiments, the vias 36a and 36b are formed by a conventional dual damascene process, thus resulting in vias having a variable cross section, e.g., a larger cross section "X" at a top portion than at a lower portion. For example, a first patterned resist is used to form an initial via to a depth of the hardmask 30, with a second patterned resist forming the larger cross section "X". Alternatively, the first patterned resist forms the larger cross section "X", with the second patterned resist forming the deeper portion of the vias 36a and 36b, e.g., to a depth of the hardmask 30. In embodiments, the via 36a are used for an interconnect structure; whereas, the via 36b will be used for an e-fuse.

Figure 9:
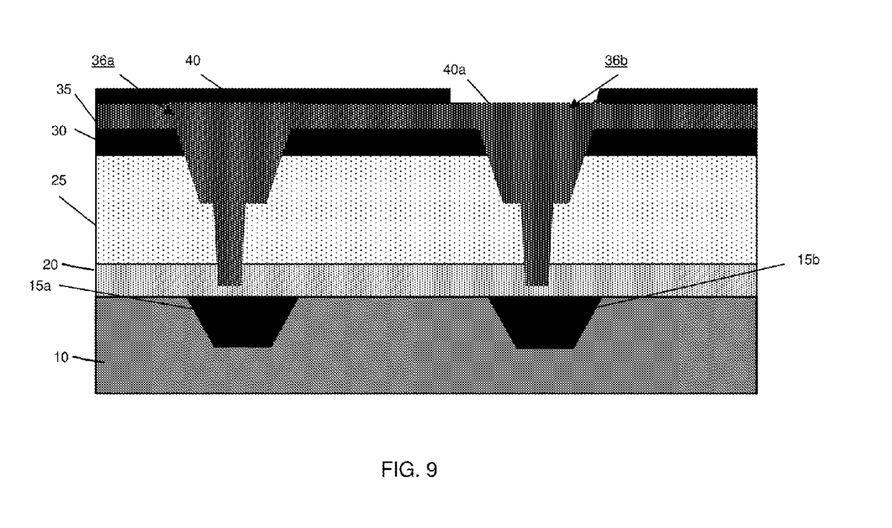

In FIG. 9, a material 35 is deposited in the vias 36a and 36b and on a surface of the hard mask 30. The material 35 is, for example, any organic material such as an organic planarization layer. In optional embodiments, the material 35 can be planarized using, for example, a chemical mechanical polish (CMP) process. A bottom antireflective coating (BARC) or other type of resist 40 is deposited on the material 35. In embodiments, the BARC is used to enhance control of critical dimensions (CD) by suppressing standing wave effects and reflective notching caused by thin film interference. An opening 40a is formed in the resist 40 using conventional lithographic processes, which is aligned with the filled via 36b. The use of the dual damascene trench configuration will eliminate the need for an offset opening.

Figure 10:
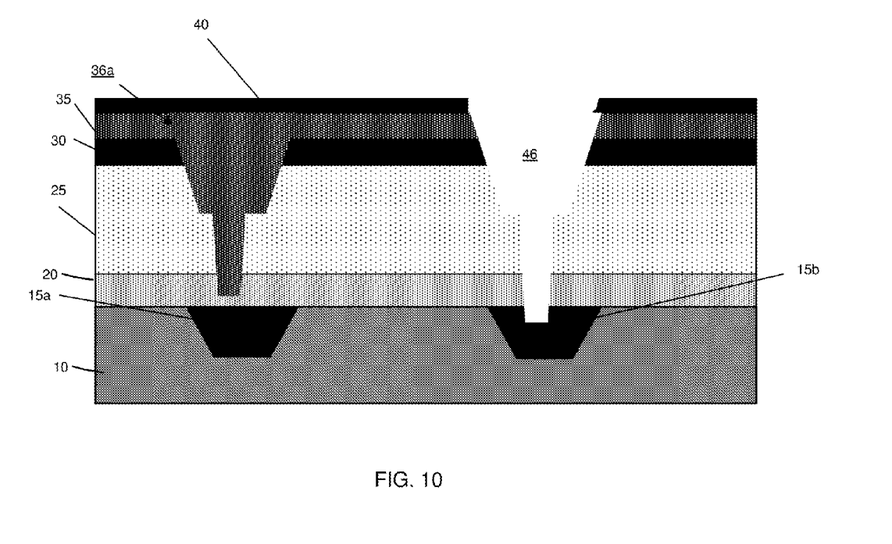

In FIG. 10, the structure undergoes an etching process (RIE), to form a via 46. In embodiments, the via 46 punches through the hardmask layer 20, contacting or exposing the wire 15b. In embodiments, the via 46 may also extend into the wire 15b. As shown in FIG. 10, the cross section of the via 46 has changed, compared to that of the via 36a, due to the additional processing. Also, due to the protection afforded by the resist 40, the depth of the via 36a will not be affected during this etching process.

Figure 11:
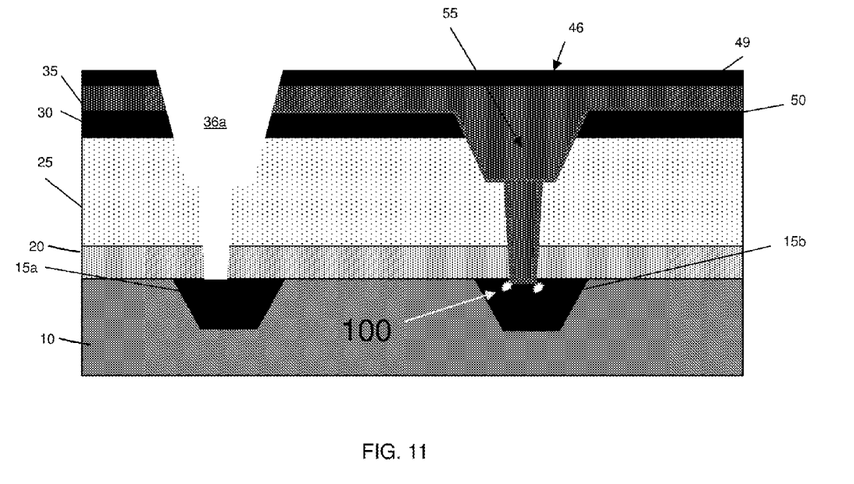

In FIG. 11, the resist 40 and remaining material 35 are removed using conventional etching processes. In embodiments, the material 35 is removed from the surface of the hardmask 30 and within the via 36a using a conventional via RIE process. In an optional embodiment, the hardmask 30 can be planarized, using CMP processes. A film 50 is deposited within the vias 36a and 46, to form a protective barrier; although the film will be removed from the via 36a in subsequent processes steps. In embodiments, the film 50 is a low temperature oxide or SiN film, deposited to a depth of about 10 Å to 50 Å at the bottom of the via 46; although other dimensions are also contemplated by the present invention as discussed above.

Still referring to FIG. 11, the vias 36a and 46 are filled with material 55. The material can be any organic material, e.g., organic planarization layer. In embodiments, the organic material 55 contacts the metal of the wire 15b and hence forming voids 100, i.e., defects, in the metal of the wire 15b (corrode the metal). The organic material 55 will not contact nor corrode the wire 15a because the via 36a does not yet punch through the cap layer 20 and allow any contact therebetween. In embodiments, the material 55 is also formed on the surface of the hardmask 30.

To deepen the via 36a thus exposing the underlying metal of the wire 15a, the material 55 and the film 50 are removed from the via, using conventional etching process. This etching process results in the via 36a punching through the cap layer 20 and exposing the metal of wire 15a. During this process, the filled via 46 is protected by resist 49. In embodiments, the resist 49 is, for example, BARC, which is patterned to form an opening coinciding with the via 36a which, thereafter undergoes additional etching, e.g., via RIE, to deepen the via 36a.

Figure 12:
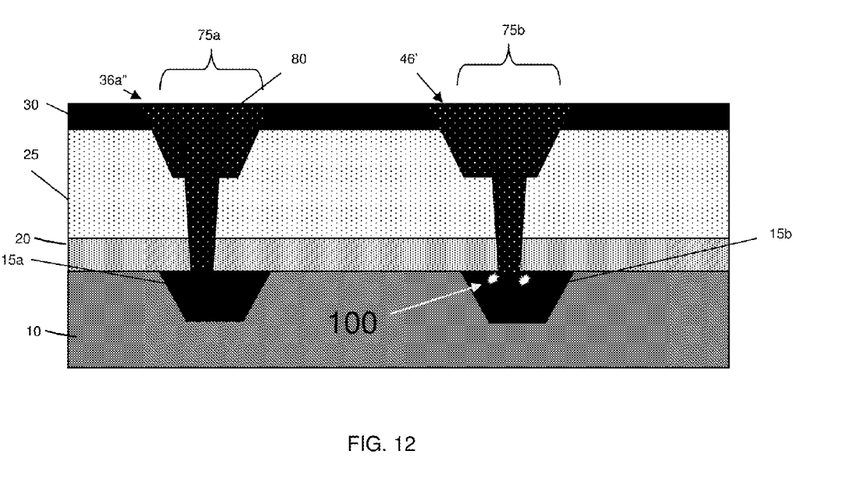

In FIG. 12, the resist 49 and any remaining film 50 and material 55 are removed using conventional etching processes (RIE). Metal 80 is deposited in the vias 36a and 46 using conventional deposition methods. The metal 80 can be tungsten or TaN, deposited using an atomic layer deposition or sputtering process; although, other deposition processes are also contemplated by the present invention. In this way, an interconnect 75a is formed in contact with the wire 15a, and an e-fuse 75b is formed in contact with the wire 15b. As should be understood, the metal 80 contacts the voids 100 formed in the wire 15b, which alters the characteristics of the metal (in comparison to the interconnect 75a) allowing it to work as an e-fuse 75b.

Figure 13:
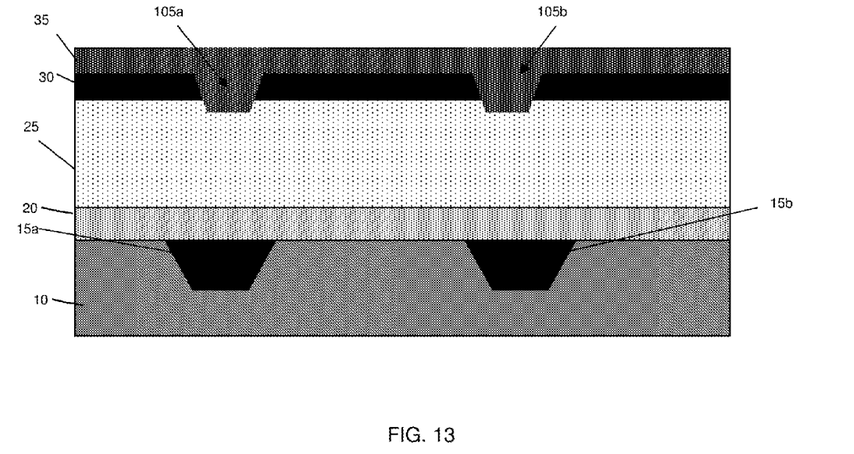
FIGS. 13-18 show processing steps and respective structures in accordance with additional aspects of the invention.

FIGS. 13-18 show processing steps and respective structures in accordance with additional aspects of the invention. More specifically, the structure of FIG. 13 is representative of any wiring level of a semiconductor device. In embodiments, the structure includes a substrate 10 that, in embodiments, is any insulator material. In embodiments, the substrate 10 can be provided on any wafer. The wafer can be any bulk substrate, including silicon or a silicon on insulator (SOI) substrate. Wires 15a and 15b are formed in the substrate 10 using conventional lithographic, etching and deposition processes, as discussed above.

Still referring to FIG. 13, a cap layer 20 is formed over the wires 15a and 15b and any exposed surfaces of the substrate 10. In embodiments, the cap layer 20 can be a nitride block, which alleviates corrosion of the wires 15a and 15b, in subsequent processing steps. An insulator layer 25 is formed on the cap layer 20 using a conventional deposition process (CVD). In embodiments, the insulator layer 25 can be oxide or silicon dioxide; although other materials with a lower dielectric constant value are also contemplated by the present invention. The other material can be Si-Me containing organosilicate materials (k=2.7-3.0). A hardmask 30 is formed on the insulator layer 25 using conventional processes such as CVD. The hardmask 30 may be nitride.

Vias 105a and 105b are formed in the structure using conventional lithographic and etching processes (RIE). More specifically, the vias 105a and 105b are formed simultaneously through the hardmask 30 and insulator layer 25, in alignment with the respective wires 15a and 15b. A material 35 is deposited in the vias 105a and 105b and on a surface of the hard mask 30. The material 35 may be any organic material, including an organic planarization layer. In optional embodiments, the material 35 can be planarized using a chemical mechanical polish (CMP) process.

Figure 14:
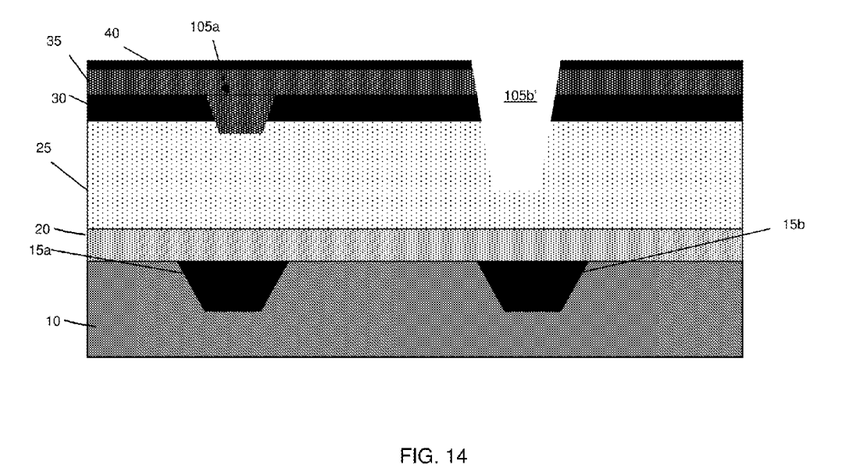

In FIG. 14, a BARC or other type of resist 40 is deposited on the material 35. In embodiments, the BARC is used to enhance control of critical dimensions (CD) by suppressing standing wave effects and reflective notching caused by thin film interference. An opening is formed in the resist 40 using conventional lithographic processes, which is aligned with the filled via 105b of FIG. 13. The structure undergoes an etching process (RIE), to deepen the filled via, thus forming new via 105b'. The resist 40, however, protects the via 105a from being affected, e.g., becoming deeper, during this etching processes.

Figure 15:
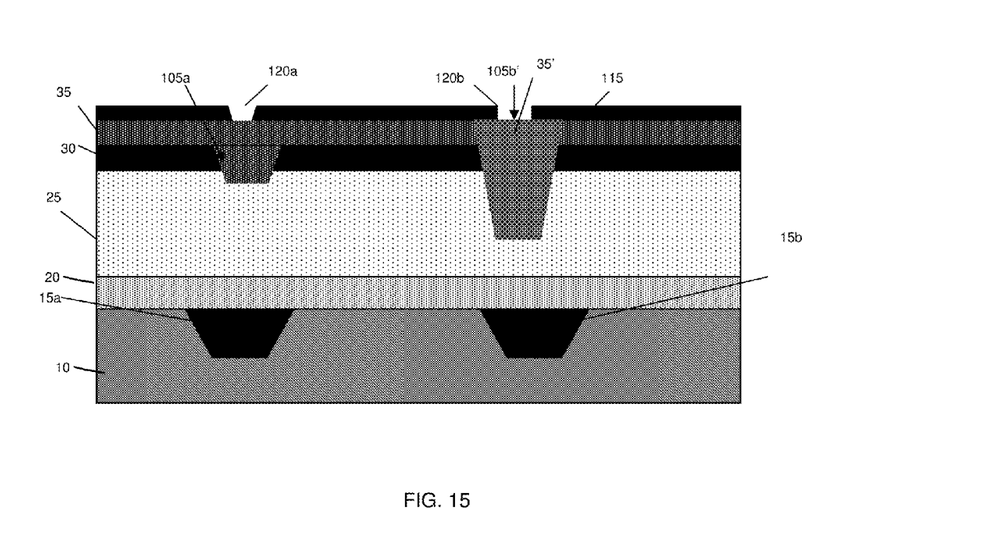

In FIG. 15, the via 105b' is filled with additional material 35' which may be the organic material. A BARC or other type of resist 115 is deposited on the material 35 (and 35'), and patterned to form openings 120a and 120b in alignment with the respective filled vias 105a and 105b'.

Figure 16:
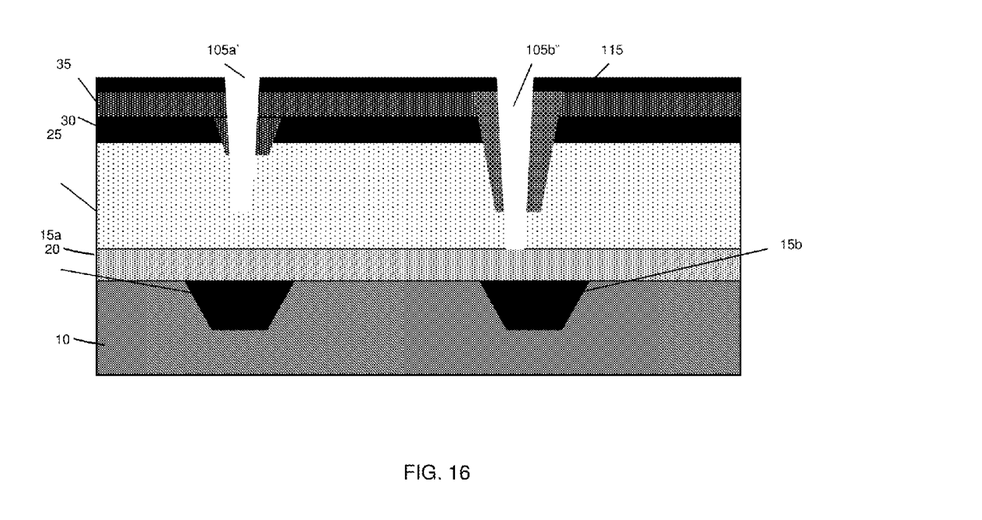

In FIG. 16, vias 105a' and 105b" are formed through the previously filled vias using conventional etching processes, e.g., RIE. In embodiments, the via 105b" will land on the cap layer 20; whereas, the via 105a' will not land on the cap layer 20. This is due to the fact that the via 105b' was initially deeper than the via 105a.

Figure 17:
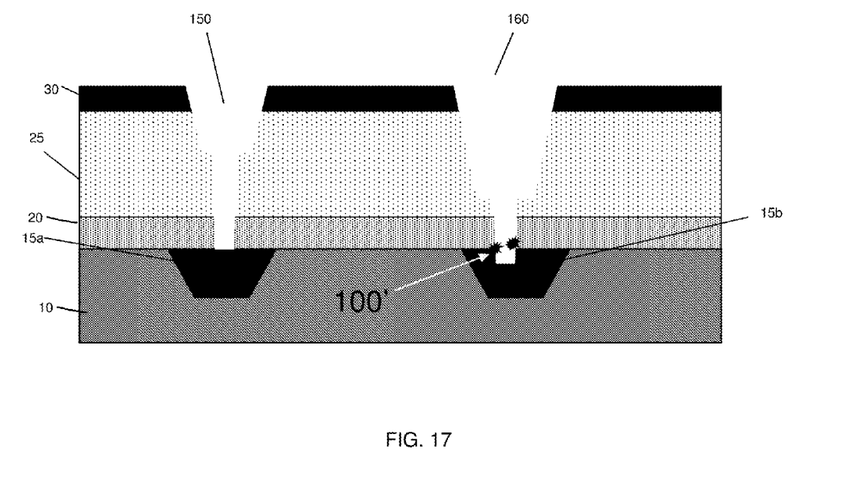

In FIG. 17, the vias 105a' and 105b" undergo a trench etch using conventional etching processes, e.g., RIE or ion beam etching. The trench etch results in the via 105b" punching through the cap layer 20 and exposing the underlying metal of the wire 15b, faster than the via 105a'. In this way, the etchant contacts the underlying metal of the wire 15b which, in turn, results in a defect of metal sputter 100', in embodiments being copper sputter, on the sidewalls of the via 105b". The copper sputter results from surface morphology developed by sputter instability during etching of the via 105b". The metal sputter 100' (defect) results in a copper defect in the via 105b", which can be used for forming the e-fuse.

Figure 18:
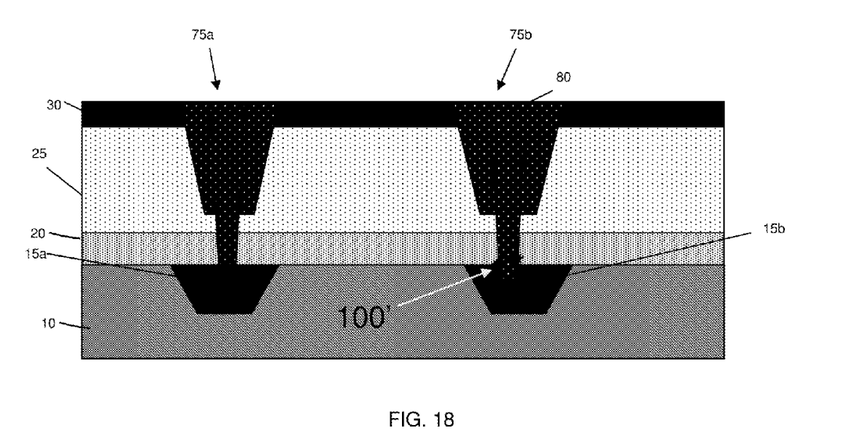

In FIG. 18, metal 80 is deposited in the vias 105a' and 105b" using conventional deposition methods. The metal 80 can be tungsten or TaN deposited using an atomic layer deposition or sputtering process; although, other deposition processes are also contemplated by the present invention. In this way, an interconnect 75a is formed in contact with the wire 15a, and an e-fuse 75b is formed in contact with the wire 15b. As should be understood, the metal 80 contacts the metal sputter 100' formed in the wire 15b, which alters the characteristics of the metal (in comparison to the interconnect 75a) allowing it to work as an e-fuse 75b. As in all embodiments, BEOL structures such as transistors or passive devices can then be formed using conventional BEOL processes.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method, comprising:
   forming an interconnect via in a substrate in alignment with a first underlying metal wire;
   forming an e-fuse via in the substrate, exposing a second underlying metal wire;
   forming a defect with the second underlying metal wire;
   filling the interconnect via with metal and in contact with the first underlying metal wire thereby forming an interconnect structure; and
   filling the e-fuse via with the metal and in contact with the defect and the second underlying metal wire thereby forming an e-fuse structure,
   wherein the defect is metal voids formed by filling the e-fuse via with an organic material which contacts the second underlying metal wire.

2. The method of claim 1, wherein a second via is lined with a liner prior to filling the e-fuse via with the organic material.

3. The method of claim 2, further comprising removing the organic material and the liner, prior to filling the interconnect via and the e-fuse via with the metal.

4. The method of claim 2, wherein the organic material is an organic planarization layer.

5. The method of claim 2, wherein the interconnect via is filled with material and protected by a resist when the e-fuse via is filled with the organic material.

6. A method, comprising:
forming an interconnect via in a substrate in alignment with a first underlying metal wire;
forming an e-fuse via in the substrate, exposing a second underlying metal wire;
forming a defect with the second underlying metal wire;
filling the interconnect via with metal and in contact with the first underlying metal wire thereby forming an interconnect structure; and
filling the e-fuse via with the metal and in contact with the defect and the second underlying metal wire thereby forming an e-fuse structure,
wherein the defect is a metal sputter formed on sidewalls of the e-fuse via.

7. The method of claim 6, wherein the metal sputter is formed by etching of the e-fuse via in contact with the second underlying metal wire.

8. The method of claim 7, wherein the metal sputter is copper sputter formed by etchant contacting the second underlying metal wire composed of copper.

9. A method, comprising:
forming an interconnect via in a substrate in alignment with a first underlying metal wire;
forming an e-fuse via in the substrate, exposing a second underlying metal wire;
forming a defect with the second underlying metal wire;
filling the interconnect via with metal and in contact with the first underlying metal wire thereby forming an interconnect structure; and
filling the e-fuse via with the metal and in contact with the defect and the second underlying metal wire thereby forming an e-fuse structure,
wherein forming the e-fuse via exposes the second underlying metal wire, prior to the interconnect via exposing the first underlying metal wire.

10. The method of claim 1, wherein:
foaming the interconnect structure further comprises:
forming a via of a first depth in the substrate, stopping at a blocking layer protecting the first underlying metal wire;
filling the via with a material;
forming the interconnect via by performing a trench etch to remove the material in the via and deepen the via through the blocking material, which exposes portions of the underlying metal wire; and
filling the interconnect via with the metal, which contacts with the first underlying metal wire; and
forming the e-fuse structure further comprises:
forming second via of the first depth in the substrate in a same processing as the forming of the via;
forming the e-fuse via by deepening the second via to punch through the blocking layer and to expose the second underlying metal wire, while maintaining the depth of the via with a protection layer;
filling the e-fuse via with organic material to form the defect, which comprise voids in the second underlying metal wire, wherein the via is protected during the filling step; and
filling the e-fuse via with the metal and in contact with the voids.

11. The method of claim 1, wherein:
forming the interconnect structure further comprises:
forming a first dual damascene via of a first depth in the substrate, stopping at a blocking layer protecting the first underlying metal wire;
filling the first dual damascene via with a material; and
forming the interconnect via by removing the material in the first dual damascene via, which deepens the first dual damascene via through the blocking material to expose portions of the first underlying metal wire; and
filling the interconnect via with the metal, which contacts the first underlying metal wire; and
forming the e-fuse structure further comprises:
forming a second dual damascene via of the first depth in the substrate;
forming the e-fuse via by deepening the second dual damascene via to punch through the blocking layer and to expose the second underlying metal wire, while maintaining the depth of the first dual damascene via with a protection layer;
filling the e-fuse via with organic material to form the defect, which comprises voids in the second underlying metal wire, while the first dual damascene material remains filled with the material to maintain its depth; and
filling the e-fuse via with the metal, which contacts the voids.

12. The method of claim 1, wherein:
forming the interconnect structure further comprises:
forming a via of a first depth in the substrate;
filling the via with a material; and
forming a second via through the material and into the substrate;
forming the interconnect via by performing a trench etch to deepen the second via through a blocking material and to expose portions of the first underlying metal wire; and
filling the interconnect via with the metal, which contacts the first underlying metal wire; and
forming the e-fuse structure further comprises:
forming another via of the first depth in the substrate in a same processing as the forming of the via;
filling the another via with the material, during a same processing as filling the via with the material;
while protecting the via with the material, forming a deep via through the another via filled with the material and into the substrate;
filling the deep via with additional material;
forming a third via through the deep via, which extends to the blocking material, during a same processing as forming the second via, wherein the third via is formed deeper than the second via;
forming the e-fuse via by performing a trench etch to deepen the third via through the blocking material, during a same processing as forming the interconnect via, wherein the trench etch exposes portions of the second underlying metal wire prior to exposing the first underlying metal wire, thereby creating a sputter metal defect in the second trench; and
filling the e-fuse via with the metal, which contacts with the sputter metal defect and the second underlying metal wire.

13. A method, comprising:
forming an interconnect via in a substrate in alignment with a first underlying metal wire;
forming an e-fuse via in the substrate, exposing a second underlying metal wire;
forming a defect with the second underlying metal wire;

filling the interconnect via with metal and in contact with the first underlying metal wire thereby forming an interconnect structure; and filling the e-fuse via with the metal and in contact with the defect and the second underlying metal wire thereby forming an e-fuse structure, wherein the interconnect via and the e-fuse via are formed in a same processing step, with the e-fuse via exposing the second underlying metal wire faster than the interconnect via exposes the first underlying metal wire.

14. A method of forming an e-fuse structure and an interconnect structure, comprising:

forming a plurality of wires in a dielectric layer;

forming a first via in the dielectric layer to a first wire of the plurality of wires;

forming a second via in the dielectric layer to a second wire of the plurality of wires;

forming a defect from the second wire of the plurality of wires; and filling the first via and the second via with metal material, wherein the metal material contacts the first wire to form an interconnect structure and the metal material contacts the second wire and the defect to form an e-fuse, wherein the defect is a plurality of voids formed in the second wire, by contacting the second wire with organic material filling the second via.

15. The method of claim 14, wherein the second via is deeper than the first via and exposes the second wire before the first via exposes the first wire.

16. A method of forming an e-fuse structure and an interconnect structure, comprising:

forming a plurality of wires in a dielectric layer;

forming a first via in the dielectric layer to a first wire of the plurality of wires;

forming a second via in the dielectric layer to a second wire of the plurality of wires;

forming a defect from the second wire of the plurality of wires; and filling the first via and the second via with metal material, wherein the metal material contacts the first wire to form an interconnect structure and the metal material contacts the second wire and the defect to form an e-fuse, wherein the defect is a metal sputter in the second via formed by etching.

17. The method of claim 14, wherein the filling the first via and the second via with metal material are formed in a same processing step.

18. The method of claim 14, wherein the defect is formed while protecting the first via with resist.

* * * * *